United States Patent [19]

Hagihara et al.

[11] Patent Number: 4,685,211
[45] Date of Patent: Aug. 11, 1987

[54] METHOD OF PRODUCING A COOLED ELECTRONIC ASSEMBLY

[75] Inventors: Takashi Hagihara; Yuzi Kuramitsu, both of Tokyo, Japan

[73] Assignee: NEC Corporation, Tokyo, Japan

[21] Appl. No.: 882,115

[22] Filed: Jul. 3, 1986

Related U.S. Application Data

[62] Division of Ser. No. 764,278, Aug. 9, 1985, Pat. No. 4,628,990.

[30] Foreign Application Priority Data

Aug. 17, 1984 [JP] Japan .................... 59-171059
May 28, 1985 [JP] Japan .................... 60-79540[U]

[51] Int. Cl.$^4$ ................... H05K 3/30; F28F 7/00
[52] U.S. Cl. ................... 29/832; 165/80.4; 165/185; 357/82
[58] Field of Search ............. 29/832, 837, 842, 840; 165/80.4, 185; 357/81, 82; 361/385, 386; 174/16 HS X

[56] References Cited

U.S. PATENT DOCUMENTS

| | | | |
|---|---|---|---|
| 3,993,123 | 11/1976 | Chu et al. | 165/80.4 |
| 4,069,498 | 1/1978 | Toshi | 357/81 |
| 4,235,283 | 11/1980 | Gupta | 165/80.4 |
| 4,341,432 | 7/1982 | Cutchaw | 165/80.4 |
| 4,381,032 | 4/1983 | Cutchaw | 165/80.4 |

Primary Examiner—Timothy V. Eley
Attorney, Agent, or Firm—Sughrue, Mion, Zinn, Macpeak, and Seas

[57] ABSTRACT

Cooling equipment for use in electronic systems of type having a substrate with a plurality of heat-generating electronic components mounted thereon is disclosed. A hat assembly is provided having a plurality of cavities in which pistons can be slidably mounted. The hat assembly is placed adjacent to the substrate such that the pistons are next to the components. The pistons are then adjusted and fixed in the hat assembly so that a desired gap is maintained between the pistons and the components. A cooling plate is attached to the assembly.

3 Claims, 12 Drawing Figures

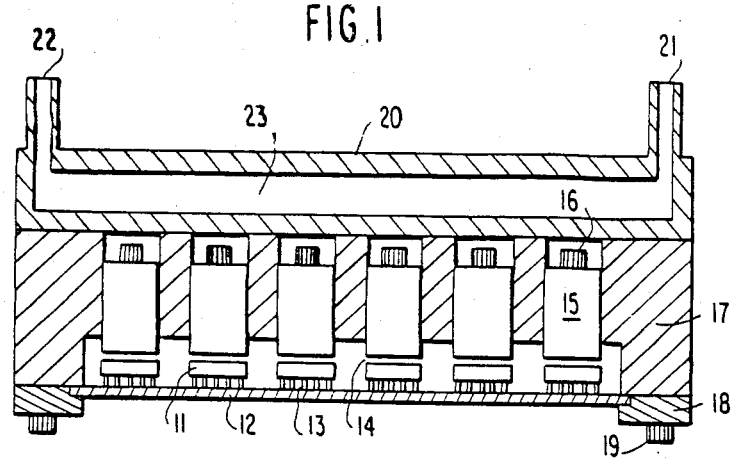
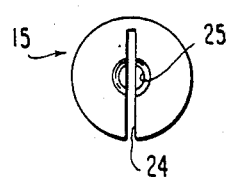
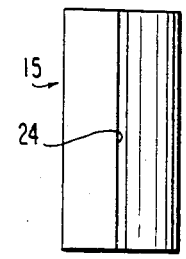
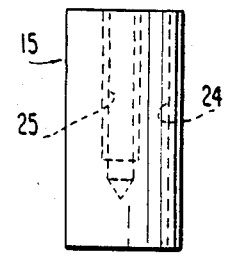
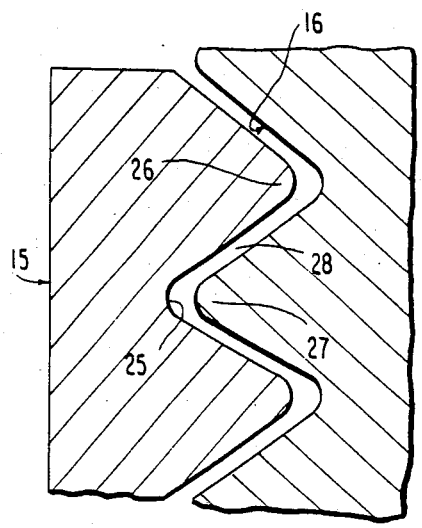
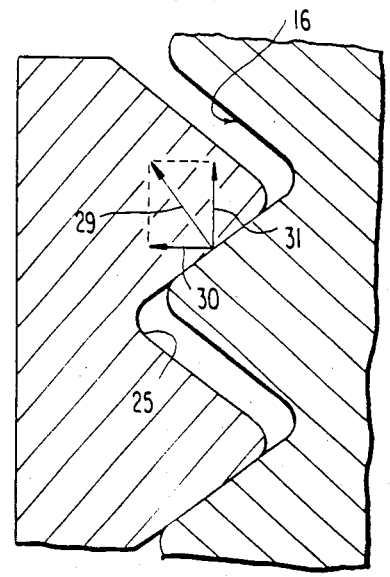

METHOD OF PRODUCING A COOLED ELECTRONIC ASSEMBLY

This is a division of application Ser. No. 764,278, filed Aug. 9, 1985, and now U.S. Pat. No. 4,628,990.

BACKGROUND OF THE INVENTION

The present invention relates to cooling equipment for an integrated circuit chip.

For integrated circuits (IC) mounted on a print wired board or a ceramic substrate, air cooling equipment is usually used. In such equipment, the cooling air is blown against the heat sink or the case. However, for the following reasons, use of air as a cooling medium to carry the heat from an IC has some disadvantages and problems.

The first reason is the necessity for relatively large air conditioning capability to lower the air temperature because the temperature difference between the heat sink or IC case and air is large. A large amount of air must be sent into the unit to remove the heat generated by the unit, since the heat capacity of the air is small. Further, modern data processors comprise high density and high power ICs to speed up processing and signal transmission, thus increasing both the quantity of heat and the density of heat generated. Accordingly, the air conditioner needs high capacity and, inside the unit, an air blower must give high airflow and exhausting ability to compensate for the reduction of the air path inside the unit caused by high density mounting of components and to exhaust the great amount of heat from the unit. The necessity for an air conditioner with high cooling capacity and large throughput also can cause excessive noise. Further, since it is difficult for the air stream to be distributed equally in the unit, the temperature of the ICs may rise locally, causing deterioration of the reliability of the unit.

To solve these defects, an example of liquid cooling unit is proposed in the article entitled "A Conduction-Cooled Module for High-Perfomance LSI Devices", by S. Oktay et al, published in the *IBM J. Res. Develop.*, Vol. 26, No. 1, January 1982, pages 55–66. Referring to FIG. 1(b) of the article, the surface of a chip mounted on the substrate is contacted by spring loaded piston so that the heat from the chip is conducted to a "hat" via the piston and helium. The hat is cooled by cooling medium utilizing a water cooled cold plate heat sink.

The module as proposed by Oktay et al has the following shortcomings. First, since the semiconductor chip mechanically contacts the piston, it is impossible to achieve electrical isolation between the chip and the cooling medium. As the cooling medium is electrically connected to the earth terminal of a compressor or a pump for sending out the cooling medium, if a conductive cooling medium is used, the chip can misoperate. Next, a vibrating system expressed in the equation of $W_o = \sqrt{k/m}$ ($W_o$ shows sympathetic angular frequency, K shows constant of the spring, and m shows mass of the piston) is made up by the piston and the spring. If the power including a sympathetic frequency element from outside puts pressure on the module, vibration of the piston can destroy the chip. Finally, creep transformation can occur because the solder for connecting the substrate is always under mechanical pressure. This transformation is particularly significant in the case of using solder with a low melting point.

SUMMARY OF THE INVENTION

It is therefore an object of the present invention to provide cooling equipment and a method for assembly thereof, which give improved heat conduit performance for intergrated circuit chips and equipment utilizing such chips.

It is a further object of the invention to provide improved cooling equipment which does not cause misoperation of, or damage to, the chip.

According to one embodiment of the present invention, there is provided a cooling system comprising at least one piston having a first surface located opposite a chip mounted on a substrate, a second surface for sliding the piston in a direction perpendicular to the substrate, a threaded hole in the piston for receiving a screw, and a slot portion through the center of axis of the screw hole which is expanded where the screw is driven into the hole. A hat assembly can be fixed to the substrate and has a plurality of cavities for receiving the pistons. The piston location is adjusted and fixed in the cavity by expansion of the piston due to the screws to achieve an optimum gap relative to the chip to promote efficient heat transfer without mechanical connection. A cooling fixed to the hat assembly plate has an inlet and an outlet for circulating the cooling medium.

BRIEF DESCRIPTION OF THE DRAWINGS

FIG. 1 is a cross-sectional view of a first embodiment of the invention;

FIGS. 2A, 2B, 2C, 3 and 4 show the detailed structure of the piston of the FIG. 1;

DETAILED DESCRIPTION OF THE INVENTION

Figure 5:
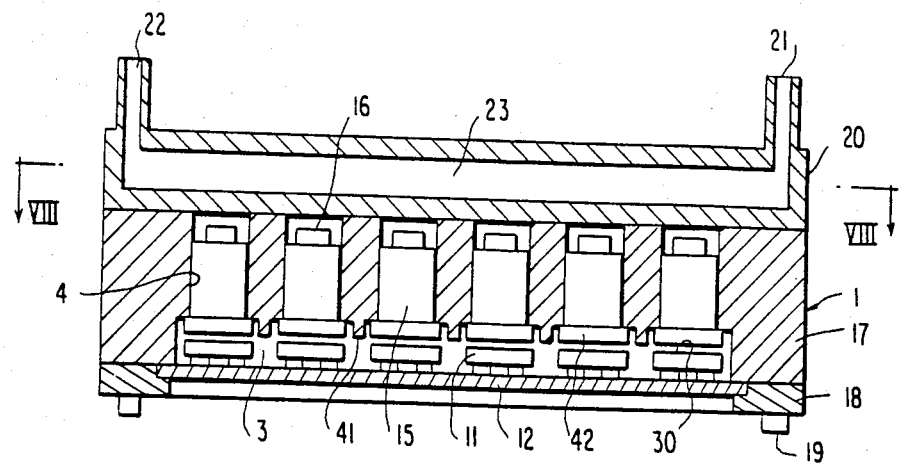
FIG. 5 is a cross-sectional view of a second embodiment of the invention.

Description will now be given of detailed embodiments of the invention. It will be recognized by those of skill in the art, however, that various modifications may be made to the basic structures described herein, and the description is not, therefore, intended to be limiting.

Referring to FIG. 1, a cooling system according to the present invention comprises a hat 17 into which pistons 15 can be inserted, frames 18 for holding a substrate 12, screws 19 for fixing the frames 18 to the hat 17, and a cooling plate 20 attached to hat 17 having internal cooling path 23 having inlet 21 and outlet 22. Chips 11 are fixed to the substrate 12 by solder 13, respectively. The pistons 15 are positioned so that there are small gaps 14 between the upper surfaces of the chips and the opposing surfaces of the pistons. The most important factor determining the cooling ability according to the present invention is the width of the gaps 14, so that one subject matter of this invention is to make a gap as thin as possible.

Generally speaking, since the chips 11 are fixed to the substrate 12 by solder 13, and the range of the variation in thickness of solder 13 is normally over 100 μm (micron), it may be considered impossible for the gaps 14 to be of less than 100 μm. On the contrary, according to the present invention, gaps 14 of less than 100 μm can be made in the following manner.

At first, spacers (not shown in FIG. 1), for example, made from Teflon sheet of 50 μm thickness, are put on the chips 11, after the chips 11 have been soldered to the substrate 12. Then the hat 17 is fixed to the frame 18 by the screws 19. Next, the pistons 15 are inserted into holes of the hat 17 and the screws 16 are driven into the holes 25 (in FIG. 2A) of the pistons 15 in a manner described in detail hereinafter so that the pistons are pressed onto the spacers on the chips 11, and the position of the pistons in the hat is fixed.

Next, the screws 19 are removed, and the frame is disassembled from the hat so that the spacers can be removed. The frame and hat are then reassembled with the screws 19 so that a gap space 14 corresponding to the spacers exists between the pistons and the chips.

Next, the method whereby the pistons 15 are fixed to the hat will be explained. Referring to FIGS. 2A, 2B, and 2C, each of the pistons 15 is cylindrical, has a threaded screw hole 25 in its center, and has a slit 24 through the axis thereof. Referring to FIG. 3, the hole and screw are configured such that they have the same contour, but there is a gap 28 therebetween.

Referring now to FIG. 4, when the screw is driven into the screw hole, the surface of the screw 16 contacts the surface of the screw hole 25, so that the pressure 29 is generated. The pressure 29 has components in the diameter direction (30) and the axis direction (31). Since the diameter direction pressure element 30 functions to widen the slit 24 of the piston 15, the outer cylindrical surface of the piston 15 and the inside surface of the cavity are contacted, so that the piston 15 is fixed to the hat 17 by friction.

Referring now back to FIG. 1, after the gap 14 is set for all the chips 11, the cooling plate 20 is fixed to the upper surface of the hat 17. The cooling medium is circulated through the path 23 and heat is transferred from the chips to the cooling medium across the gaps to the pistons and through the hat and cooling plate. It will be recognized that this system does not have the disadvantages of the prior art in that there is no electrical or mechanical connection between the chip and the piston and the piston does not have the possibility of vibrating.

In the embodiment described above, when the screw 16 is driven to fix the piston 15 to the hat 17, the piston 15 may rotate. About 90% of the torque exerted by driving the screw 16 is converted into friction power, and only the other 10% of the torque is converted into driving in the axis direction. Accordingly, the diameter direction pressure 29 is relatively less than the torque. As a result, the degree of fixing for piston 15 to the surface of the hole of the hat 17 becomes relatively low.

To solve this disadvantage, a second embodiment according to the present invention will be explained.

Referring to FIG. 5, a cooling system embodying to the present invention comprises a hat assembly 17 which has cavities 4 and guides or stops 41. The combination of the cavities 4 and the guides form and define concave portions of the hat having a larger dimension than the cavities 4 designated as 3. Frame 18 is fixed to the hat 17 by screws 19. Pistons 15 adapted to receive screws 16 and having a stopper portion 42 are slid into the holes 4. A cooling plate 20 having inlet 21 and outlet 22 is fixed to the hat assembly 17. A substrate 12 with chips 11 is fixed to the hat assembly 17 and the frame 18 so that a small gap 14 exists between the surface of the chips 11 and the stopper portion 42 of the pistons 15.

Figure 6A:
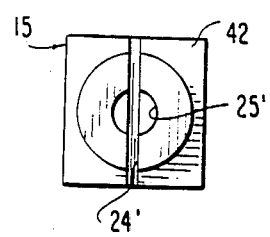
FIGS. 6A, 6B and 7 show the detailed structure of the piston of the FIG. 5.
Figure 6B:
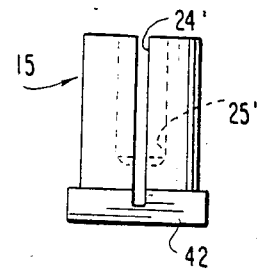

Referring to FIGS. 6A and 6B, it will be seen that a slit 24' has been made through the center of axis of the piston 15 and extends into stopper 42. It will be seen that the stopper portion is square and it is of a dimension such that when rotated it will engage guide 41 to prevent the piston from rotating.

Next, the method for assembling the second embodiment will be explained. Referring to FIGS. 5, 6A, 6B and 7, the hat assembly 17 is inverted. Next, one of the pistons 15 is slid into the cavity 4 and up to the stopper portion 42. The screw 16 is then driven into the threaded hole 25' of the piston 15. In this manner, the piston 15 is temporarily fixed to the hat assembly. In this procedure, the rotation of the stopper portion 42 is stopped by the guide 41. The other pistons 15 are temporarily fixed to the hat assembly 17 in the same manner. Next, spacers (not shown in the Figures) of 50 μm thickness are mounted on the stopper portions 42 of the pistons 15; then, the substrate 12 is fixed to the hat assembly 17 by the frame 18 and the screws 19 so that the chips 11 mounted on the substrate 12 face the stopper portions 42. Next, the hat assembly is turned over again. Then the screws 25 are loosened, so that the temporary fixing of the pistons 15 is undone. Then the pistons 15 are slid so that the stopper portions 42 and the spacers are in contact with the chips. Next, the screws 16 are driven again, so that the pistons 15 are fixed to the hat assembly 17. In this step also, the rotation of the pistons 15 is prevented by abutting of the stopper portions 42 against the guides 41. After fixing the pistons to the hat assembly, the substrate 12 is removed and the spacers are removed. Then the substrate 12 is refixed to the hat 17. By this procedure, a small gap 14 of desired size is formed between the chips 11 and the stopper portions 42 of the pistons. Finally, the cooling plate 20 is fixed to the top of the hat assembly.

Figure 7:
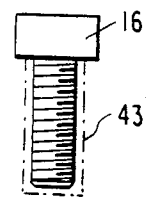

In either embodiment, a material 43 for reduction of friction can be coated on the screw 25 as illustrated in FIG. 7. For use as lubricating material 43, solid lubricant, for example, silicon, or molybdenum nitride powder, is better than grease or machine oil. However, grease or machine oil can be used. The material 43 for reduction of friction is coated on both the screw 16 and the threaded hole 25.

Figure 8:
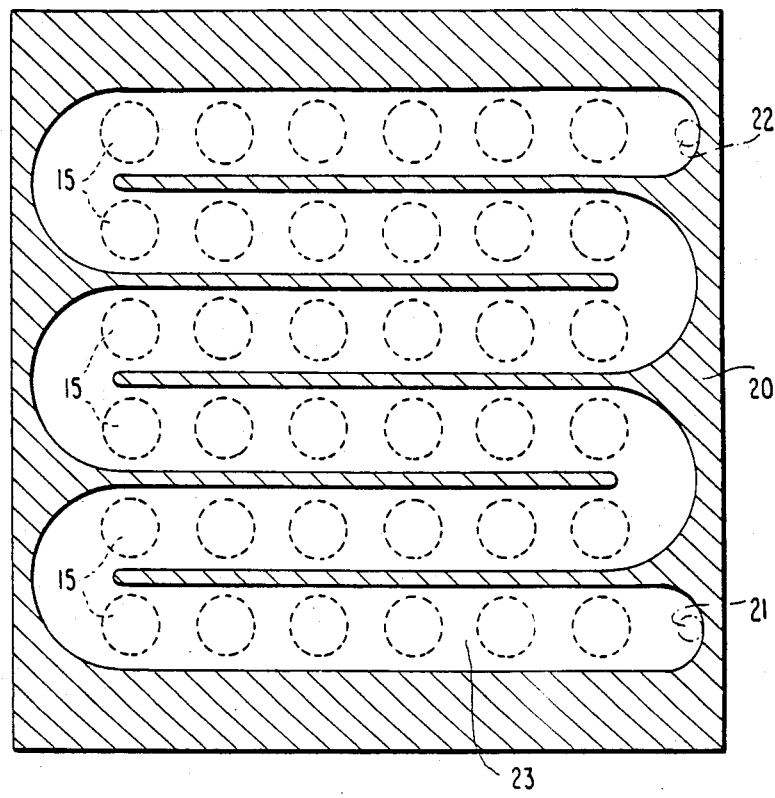
FIG. 8 shows a cross-sectional view of apparatus for circulating the cooling medium stream.

Referring now to FIG. 8, an embodiment of the cooling plate will be described. As illustrated, the cooling path 20 is a winding one, and the pistons 15 are arranged in 6×6 matrix. The cooling path is positioned over a row or line of the pistons 15, and is then reversed, and positioned over another row or line of the pistons 15. Since the path 20 is positioned close to the pistons 15, all of the pistons are cooled uniformly and efficiently. Since the coolant is not itself in contact with the ICs, any suitable material can be used. In particular, a liquid coolant having a high heat capacity can be used. Suitable coolants would include water.

Figure 9:
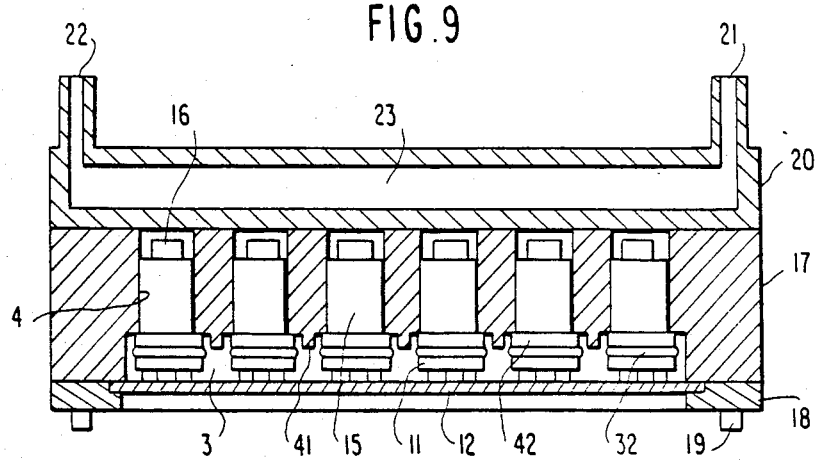
FIG. 9 is a cross-sectional view of a third embodiment of the invention.

Referring now to FIG. 9, in this embodiment, the gap 14 between the chips 11 and the stopper portions 42 of the pistons is filled with material 32 to enhance heat transfer. This material can be, for example, a silicon powder.

This present invention provides an improved cooling assembly wherein the mechanical contact between the chips and the pistons is eliminated while at the same time efficient heat transfer is achieved. According to this invention, the outside surfaces of the pistons 15 are closely contacted with the inside surfaces of the holes 3 of the hat assembly 17, so that the performance of heat conduct can be improved, and the cooling effect of the cooling system can be improved. On the other hand, the mechanical strength is increased, so that the reliability of the system can be improved.

What is claimed is:

1. A method of producing a cooled electronic assembly comprising the steps of:
    (a) providing a substrate having mounted thereon a plurality of heat generating electronic components;
    (b) providing a hat assembly which can be fixed to the substrate having therein cavities into which pistons having means for fixing their positions in the cavities have been slidably mounted, said cavities located so as to be adjacent to said components when the substrate and hat assembly are joined;
    (c) placing spacers on said electronic components corresponding to a desired gap distance between the electronic components and the pistons;
    (d) temporarily fixing the hat assembly to the substrate;
    (e) slidably moving the pistons into abutting relationship to the spacers and fixing the pistons in their respective cavities;
    (f) removing the hat assembly from the substrate and removing the spacers;
    (g) reassembling the hat assembly and the substrate whereby there is a gap between the pistons and the components; and
    (h) providing a cooling medium to said hat assembly.

2. The method of claim 1 further including the step of providing a section on the pistons larger than said cavities adjacent to said components and providing an element on said hat assembly for engagement with said section to prevent rotation of said piston.

3. The method of claim 1 wherein the means for fixing comprises a slot in said piston into which a screw can be driven to expand the sides of the piston into contact with the sides of the cavity.

* * * * *